United States Patent
Fuke et al.

(10) Patent No.: US 11,072,849 B2
(45) Date of Patent: Jul. 27, 2021

(54) ACTINIC-RAY-CURABLE COATING MATERIAL COMPOSITION AND LAYERED PRODUCT

(71) Applicant: Mitsubishi Chemical Corporation, Tokyo (JP)

(72) Inventors: Yoshimi Fuke, Tokyo (JP); Masatoshi Yagi, Tokyo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 185 days.

(21) Appl. No.: 16/121,028

(22) Filed: Sep. 4, 2018

(65) Prior Publication Data

US 2019/0003032 A1    Jan. 3, 2019

Related U.S. Application Data

(63) Continuation of application No. PCT/JP2017/008271, filed on Mar. 2, 2017.

(30) Foreign Application Priority Data

Mar. 4, 2016  (JP) .............................. JP2016-042408
May 30, 2016  (JP) .............................. JP2016-107456

(51) Int. Cl.
| | | |
|---|---|---|
| *C23C 14/02* | (2006.01) | |
| *C23C 14/20* | (2006.01) | |
| *C08F 2/50* | (2006.01) | |
| *C08F 2/48* | (2006.01) | |
| *C08F 257/02* | (2006.01) | |
| *C08F 212/08* | (2006.01) | |
| *B32B 27/16* | (2006.01) | |
| *B32B 15/08* | (2006.01) | |
| *C09D 4/06* | (2006.01) | |
| *C09D 201/06* | (2006.01) | |
| *C09D 151/00* | (2006.01) | |
| *C09D 5/00* | (2006.01) | |
| *C09D 7/63* | (2018.01) | |
| *C09D 125/14* | (2006.01) | |
| *C08F 265/06* | (2006.01) | |

(52) U.S. Cl.
CPC ............ *C23C 14/024* (2013.01); *B32B 15/08* (2013.01); *B32B 27/16* (2013.01); *C08F 2/48* (2013.01); *C08F 2/50* (2013.01); *C08F 212/08* (2013.01); *C08F 257/02* (2013.01); *C08F 265/06* (2013.01); *C09D 4/06* (2013.01); *C09D 5/002* (2013.01); *C09D 7/63* (2018.01); *C09D 125/14* (2013.01); *C09D 151/003* (2013.01); *C09D 201/06* (2013.01); *C23C 14/20* (2013.01)

(58) Field of Classification Search
CPC ......... C23C 14/024; C23C 14/20; C08F 2/48; C08F 2/50; C08F 212/08; C08F 257/02; C08F 265/06; C09D 4/00; C09D 4/06; C09D 5/002; C09D 7/63; C09D 125/14; C09D 151/003; C09D 201/06; B32B 15/08; B32B 27/16
See application file for complete search history.

(56) References Cited

U.S. PATENT DOCUMENTS

| | | | | |
|---|---|---|---|---|
| 5,985,952 | A | * 11/1999 | Levy | ..................... C03C 25/106 |
| | | | | 522/100 |
| 2002/0151615 | A1* | 10/2002 | Tortorello | ................ C09D 4/00 |
| | | | | 522/96 |
| 2010/0203325 | A1 | 8/2010 | Isogai et al. | |

FOREIGN PATENT DOCUMENTS

| | | |
|---|---|---|
| CN | 101679782 A | 3/2010 |
| JP | 2004-107653 A | 4/2004 |
| JP | 2004-131653 A | 4/2004 |
| JP | 2011-246515 A | 12/2011 |
| JP | 2011-252078 A | 12/2011 |
| JP | 2014-037454 A | 2/2014 |
| JP | 2016-069653 A | 5/2016 |
| WO | WO-2015045200 A1 * | 4/2015 ........... C09D 133/06 |

OTHER PUBLICATIONS

Machine translation of WO 2015/045200 A1 (Year: 2015).*
Machine translation of JP 2011-246515 A. (Year: 2011).*
Machine translation of JP 2004-131653 A. (Year: 2004).*
International Search Report issued in related International Patent Application No. PCT/JP2017/008271 dated Apr. 11, 2017. x.
Office Action issued in counterpart Chinese Patent Application No. 201780008440.3 dated Oct. 22, 2019.
Office Action issued in counterpart Japanese Patent Application No. 2017-514578 dated Mar. 2, 2021.

* cited by examiner

*Primary Examiner* — Ramsey Zacharia
(74) *Attorney, Agent, or Firm* — Morgan, Lewis & Bockius LLP

(57) ABSTRACT

Provided is a coating material composition which is capable of forming an undercoat layer for metallic vapor deposition, the layer being excellent in terms of adhesion to various bases and appearance. The actinic-ray-curable coating material composition according to the present invention comprises one or more resins A, a (meth)acrylate B, and a silane coupling agent C, wherein the resins A comprise a polymer A1 having a hydroxyl group with a hydroxyl value of 20-200 mg-KOH/g and/or an alkyd resin A2, the proportion of the resins A and that of the (meth)acrylate B are 20-60 mass % and 40-80 mass %, respectively, with respect to the total amount, which is taken as 100 mass %, of the resins A and the (meth)acrylate B, and the amount of the silane coupling agent C is 0.3-15 parts by mass per 100 parts by mass of the total amount of the resins A and the (meth)acrylate B.

17 Claims, No Drawings

ACTINIC-RAY-CURABLE COATING MATERIAL COMPOSITION AND LAYERED PRODUCT

TECHNICAL FIELD

The present invention relates to a coating material composition, and particularly to a coating material composition which is suitable for forming an undercoat layer for metallic vapor deposition, which has excellent adhesion to various base materials and excellent appearance, by actinic ray irradiation.

BACKGROUND ART

A resin has advantages of productivity, moldability, reduction in size, and the like. Those obtained by using a molded article of the resin as a base material, forming an undercoat layer (primer layer) on the surface thereof, and performing metallization treatment thereto by ionized evaporation, sputtering, or the like have been very widely used as members or the like of automotive components, decorative components, and home electric appliances.

In recent years, as a base material used in automotive components, in addition to a resin base material such as acrylonitrile butadiene styrene (ABS), polycarbonate (PC), high-heat PC, or an acrylic resin, less-adhesive resin base materials such as a bulk molding compound (BMC; a molding material composed of a mixture of an unsaturated polyester resin, a filler, a fibrous material, and the like), polyphenylenesulfide (PPS), aluminum die cast (ALD), and a polybutylene terephthalate/polyethylene terephthalate (PBT/PET) alloy have been known. These less-adhesive resin base materials are lightweight and excellent in impact resistance and heat resistance, and those obtained by forming an undercoat layer on these base materials and performing metallization treatment thereto are suitable, for example, as a reflecting mirror of an automotive lamp.

The reflecting mirror of the automotive lamp is often used by combining a plurality of resin base materials. For example, a base material excellent in heat resistance is used for a part near a lamp light source and a base material excellent in processability to be able to cope with a complicated shape is used for a part away from the lamp light source. A composition for forming an undercoat layer used in a resin base material such as ABS or PC has a problem in that adhesion is poor when the composition is applied to a less-adhesive resin base material such as BMC or PPS or formation of a metallic coating film by metallization treatment is difficult. In addition, since BMC, PPS, or the like has a high heatproof temperature, a problem arises in that rainbow occurs in a coating film by a heat resistance test after the metallization treatment. For this reason, when an undercoat layer is formed, it is necessary to switch the composition for forming an undercoat layer to a suitable composition depending on the type of base material and then use the suitable composition.

For example, in Patent Literature 1, an undercoat composition for metallic vapor deposition containing a homopolymer or copolymer of a specific amide group-containing (meth)acrylamide-based monomer has been proposed as an undercoat composition for metallic vapor deposition which can be applied to a less-adhesive resin base material.

CITATION LIST

Patent Literature

Patent Literature 1: JP 2004-131653 A

SUMMARY OF THE INVENTION

Problem to be Solved by the Invention

However, the undercoat composition for metallic vapor deposition described in Patent Literature 1 has a problem in that adhesion and appearance of a coating film after a heat resistance test may deteriorate depending on a base material. An object of the invention is to provide a coating material composition capable of forming an undercoat layer for metallic vapor deposition, which has excellent adhesion to various base materials and excellent appearance. In addition, another object of the invention is to provide a layered product having an undercoat layer obtained by curing the coating material composition and a metallic vapor deposition film.

Means for Solving Problem

The present inventors have conducted intensive studies in order to solve the above-described problems, and as a result, they have found out a coating material composition capable of forming an undercoat layer for metallic vapor deposition, which has excellent adhesion to various resins and excellent appearance, by blending specific amounts of a specific polymer and a specific additive, thereby reaching the invention.

The above-described problems are solved by any of the following inventions [1] to [16].

[1] An actinic-ray-curable coating material composition containing: a resin A; a (meth)acrylate B; and a silane coupling agent C, in which the resin A is a polymer A1 having a hydroxyl group with a hydroxyl value of 20 to 200 mgKOH/g and/or an alkyd resin A2, the resin A is contained in 20 to 60 mass % and the (meth)acrylate B is contained in 40 to 80 mass % in 100 mass % of the total amount of the resin A and the (meth)acrylate B, and the silane coupling agent C is contained in 0.3 to 15 parts by mass with respect to 100 parts by mass of the total amount of the resin A and the (meth)acrylate B.

[2] The actinic-ray-curable coating material composition described in [1], in which the resin A is contained in 30 to 60 mass % and the (meth)acrylate B is contained in 40 to 70 mass % in 100 mass % of the total amount of the resin A and the (meth)acrylate B.

[3] The actinic-ray-curable coating material composition described in [1], in which a mass average molecular weight of the polymer A1 is 10,000 to 80,000.

[4] The actinic-ray-curable coating material composition described in [1], in which a hydroxyl value of the polymer A1 is 40 to 180 mgKOH/g.

[5] The actinic-ray-curable coating material composition described in [1], in which the polymer A1 contains a constituent unit derived from hydroxyalkyl (meth)acrylate.

[6] The actinic-ray-curable coating material composition described in [1], in which the polymer A1 contains a constituent unit derived from a monomer represented by the following Formula (1):

[Chem. 1]

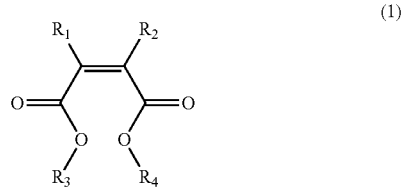

In Formula (1), $R_1$ and $R_2$ each independently represent H or $CH_3$, $R_3$ and $R_4$ each independently represent H or $C_nH_{2n+1}$, and n is from 1 to 10.

[7] The actinic-ray-curable coating material composition described in [1], in which the alkyd resin A2 is an oil-modified alkyd resin.

[8] The actinic-ray-curable coating material composition described in [1], in which the (meth)acrylate B contains polyfunctional (meth)acrylate having two to six (meth)acryloyloxy groups.

[9] The actinic-ray-curable coating material composition described in [8], in which the (meth)acrylate B contains at least one kind of (meth)acrylate selected from the group consisting of tricyclodecane dimethanol di(meth)acrylate, bis(2-acryloyloxyethyl)-2-hydroxyethyl isocyanurate, pentaerythritol tri(meth)acrylate, trimethylolpropane tri(meth)acrylate, tris(2-acryloyloxyethyl) isocyanurate, pentaerythritol tetra(meth)acrylate, dipentaerythritol penta(meth)acrylate, dipentaerythritol hexa(meth)acrylate, and polyester (meth)acrylate.

[10] The actinic-ray-curable coating material composition described in [1], in which the silane coupling agent C has an amino group or a glycidyl group.

[11] The actinic-ray-curable coating material composition described in [10], in which the silane coupling agent C contains at least one kind of silane coupling agent selected from the group consisting of N-(2-aminoethyl)3-aminopropylmethyldimethoxysilane, N-(2-aminoethyl)3-aminopropyltrimethoxysilane, 3-glycidoxypropyltrimethoxysilane, and 3-glycidoxypropylmethyldimethoxysilane.

[12] The actinic-ray-curable coating material composition described in [1], further containing a photopolymerization initiator D.

[13] The actinic-ray-curable coating material composition described in [12], in which the photopolymerization initiator D is contained in 0.1 to 20 parts by mass with respect to 100 parts by mass of the total amount of the resin A and the (meth)acrylate B.

[14] The actinic-ray-curable coating material composition described in [1], in which the actinic-ray-curable coating material composition is used in an undercoat material for metallic vapor deposition.

[15] A layered product being obtained by stacking a coating layer of the actinic-ray-curable coating material composition described in [14] and a metallic vapor deposition film on a surface of a resin base material in this order.

[16] The layered product described in [15], in which the layered product is an automotive lamp member.

Effect of the Invention

According to the invention, it is possible to provide a coating material composition which is suitable for forming an undercoat layer for metallic vapor deposition, which has excellent adhesion to various base materials and excellent appearance. The coating material composition of the invention can be cured in a short time by irradiation with actinic rays. In addition, the coating material composition of the invention can also form an undercoat layer for metallic vapor deposition on a less-adhesive base material or aluminum, glass, and the like other than a plastic base material. Further, according to the invention, it is possible to provide a layered product having an undercoat layer formed by a cured layer of the coating material composition and a metallic vapor deposition film.

MODE(S) FOR CARRYING OUT THE INVENTION

[Coating Material Composition]
Hereinafter, the invention will be described in detail. In this specification, "(meth)acrylate" means "acrylate" and/or "methacrylate," "(meth)acrylic" means "acrylic" and/or "methacrylic," "(meth)acryloyl" means "acryloyl" and/or "methacryloyl," and "(meth)acrylonitrile" means "acrylonitrile" and/or "methacrylonitrile." In addition, a resin A, a polymer A1, an alkyd resin A2, a (meth)acrylate B, a silane coupling agent C, and a photopolymerization initiator D are also described as "component A," "component A1," "component A2," "component B," "component C," and "component D," respectively. Further, an actinic-ray-curable coating material composition is also described as "coating material composition."

[Component A]
The resin A blended in the coating material composition of the invention is a polymer A1 having a hydroxyl group with a hydroxyl value of 20 to 200 mgKOH/g and/or an alkyd resin A2. This component A provides adhesion to a cured coating film of the coating material composition.

[Component A1]
The polymer A1 is a homopolymer or copolymer having a hydroxyl group with a hydroxyl value of 20 to 200 mgKOH/g and can be obtained by polymerizing a monomer having a hydroxyl group. This polymer A1 can have "other monomer units" as necessary.

Examples of the monomer having a hydroxyl group include the following hydroxyl group-containing vinyl monomers: hydroxyalkyl (meth)acrylate such as 2-hydroxyethyl (meth)acrylate, 2-hydroxypropyl (meth)acrylate, 3-hydroxypropyl (meth)acrylate, or 4-hydroxybutyl (meth)acrylate; an ethylene oxide adduct of 2-hydroxyethyl (meth)acrylate; a propylene oxide adduct of 2-hydroxyethyl (meth)acrylate; a ε-caprolactone adduct of 2-hydroxyethyl (meth)acrylate; and an organic lactone adduct of 2-hydroxyethyl (meth)acrylate. Among these, from the viewpoint of adhesion between a cured film obtained from the coating material composition and a base material, hydroxyalkyl (meth)acrylate is preferable, and 2-hydroxyethyl (meth)acrylate, 2-hydroxypropyl (meth)acrylate, 3-hydroxypropyl (meth)acrylate, and 4-hydroxybutyl (meth)acrylate are more preferable. The monomer having a hydroxyl group can be used singly or in combination of two or more kinds thereof.

A monomer serving as a raw material for constituting the "other monomer units" is a monomer which can be copolymerized with a monomer having a hydroxyl group and examples thereof include the following monomers: acrylic acid esters such as methyl (meth)acrylate, ethyl (meth)acrylate, propyl (meth)acrylate, n-butyl (meth)acrylate, t-butyl (meth)acrylate, isobutyl (meth)acrylate, 2-ethylhexyl (meth)acrylate, n-nonyl (meth)acrylate, cyclohexyl (meth)acrylate, benzyl (meth)acrylate, dicyclopentanyl (meth)acrylate, dicyclopentenyl (meth)acrylate, 2-dicyclopentenoxy ethyl (meth)acrylate, isobornyl (meth)acrylate, methoxy ethyl (meth)acrylate, ethoxy ethyl (meth)acrylate, butoxy ethyl (meth)acrylate, methoxyethoxy ethyl (meth) acrylate, ethoxyethoxy ethyl (meth)acrylate, and tetrahydrofurfuryl (meth)acrylate; styrenes or styrene derivatives such as styrene, α-methylstyrene, p-t-butylstyrene, and vinyltoluene; acrylamide compounds such as N,N-dimethyl (meth) acrylamide and N,N-diethyl (meth)acrylamide; unsaturated carboxylic acids such as (meth)acrylic acid, itaconic acid, maleic acid, and fumaric acid; polymerizable unsaturated nitriles such as (meth)acrylonitrile; unsaturated carboxylic acid esters such as diethyl maleate, dibutyl maleate, diethyl itaconate, dibutyl itaconate, diethyl fumarate, and dibutyl fumarate; and vinyl esters such as vinyl acetate and vinyl propionate.

As the monomer serving as a raw material for constituting the "other monomer units," a monomer represented by the following Formula (1) is preferable from the viewpoint of adhesion.

[Chem. 2]

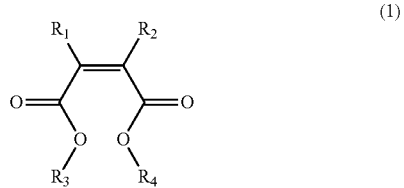

(1)

In Formula (1), $R_1$ and $R_2$ each independently represent H or $CH_3$. $R_3$ and $R_4$ each independently represent H or $C_nH_{2n+1}$, and n is from 1 to 10. n is preferably from 1 to 8, more preferably from 2 to 6, and further preferably from 2 to 4. Examples of the monomer represented by the above Formula (1) include diethyl maleate, dibutyl maleate, diethyl fumarate, and dibutyl fumarate. These monomers serving as raw materials for constituting the "other monomer units" may be used singly or in combination of two or more kinds thereof.

The mass average molecular weight of the polymer A1 is preferably 10,000 to 80,000, more preferably 15,000 to 70,000, and further preferably 20,000 to 50,000. When the mass average molecular weight of the polymer A1 is set to 10,000 to 80,000, a coating film with excellent flatness is obtained when the coating material composition is applied to the surface of the base material and the coating film can be prevented from sagging.

The hydroxyl value of the polymer A1 is 20 to 200 mgKOH/g, preferably 40 to 180 mgKOH/g, more preferably 60 to 160 mgKOH/g, and further preferably 80 to 140 mgKOH/g. When the hydroxyl value of the polymer A1 is set to 20 to 200 mgKOH/g, adhesion between a cured film obtained by the coating material composition and a base material can be made favorable.

Incidentally, the mass average molecular weight is obtained by polystyrene conversion by GPC measurement. In addition, the hydroxyl value is obtained by obtaining an amount of free hydroxyl group contained in 1 g of a vinyl-based polymer from a compositional ratio of a monomer used in polymerization and calculating an amount (unit: mg) of potassium hydroxide for neutralizing acetic acid necessary for acetylating the free hydroxyl group.

The content of the monomer unit having a hydroxyl group in the polymer A1 is preferably such an amount that the hydroxyl value of the polymer A1 becomes 20 to 200 mgKOH/g.

A polymerization method for obtaining the polymer A1 is not particularly limited, but the polymer A1 can be obtained by a conventionally known polymerization method such as a solution polymerization method, a bulk polymerization method, or an emulsion polymerization method in the presence of a radical polymerization initiator.

[Component A2]

The alkyd resin A2 can be synthesized, for example, from polyhydric alcohol, polybasic acid or an acid anhydride thereof, and fat and oil or a fatty acid thereof. The polyhydric alcohol is not particularly limited, but examples thereof include glycerin and trimethylolpropane. Examples of the polybasic acid or an acid anhydride thereof include phthalic acid, phthalic anhydride, and maleic anhydride. The oil and fat or a fatty acid of oil and fat are not particularly limited, but non-drying oil, semi-drying oil, drying oil, or fatty acids thereof can be used and examples thereof include palm oil, soybean oil, castor oil, tall oil, linseed oil, tung oil, safflower oil, and fatty acids thereof. Further, modified alkyd resin such as phenol-modified or vinyl-modified alkyd resin can also be used. The alkyd resin A2 is preferably an oil-modified alkyd resin from the viewpoint of appearance. Examples of the oil-modified alkyd resin include a palm oil-modified alkyd resin, a soybean oil-modified alkyd resin, a castor oil-modified alkyd resin, a tall oil-modified alkyd resin, a linseed oil-modified alkyd resin, a tung oil-modified alkyd resin, and a safflower oil-modified alkyd resin.

The oil length of the alkyd resin A2 (the mass ratio of oil to the resin component) is preferably 20 to 50% and more preferably 30 to 50% from the viewpoint of improvement in appearance of a cured coating film and compatibility with other components.

As the alkyd resin A2, for example, the following commercially available products can be used. Examples of the palm oil-modified alkyd resin include BECKOSOL 1323-60-EL (manufactured by DIC Corporation, oil length: 32%); examples of the tall oil-modified alkyd resin include BECKOSOL ET-3061-60 (manufactured by DIC Corporation, oil length: 30%); examples of the soybean oil-modified alkyd resin include BECKOSOL ES-4020-55 (manufactured by DIC Corporation, oil length: 40%), BECKOSOL OD-E-198-50 (manufactured by DIC Corporation, oil length: 28%), and BECKOSOL 1307-60-EL (manufactured by DIC Corporation, oil length: 41%); examples of the linseed oil-modified alkyd resin include BECKOSOL EL-4501-50 (manufactured by DIC Corporation, oil length: 45%) and BECKOSOL EQV-987 (manufactured by DIC Corporation, oil length: 50%); examples of the phenol-modified alkyd resin include BECKOSOL 1341 (manufactured by DIC Corporation, oil length: 28%) and BECKOSOL J608 (manufactured by DIC Corporation, oil length: 43%); and examples of the safflower oil-modified alkyd resin include BECKOSOL ENV-241 (manufactured by DIC Corporation, oil length: 50%) and BECKOSOL ENV-243 (manufactured by DIC Corporation, oil length: 50%). These can be used singly or in combination of two or more kinds thereof.

The blending ratio of the component A is 20 to 60 mass %, preferably 30 to 60 mass %, more preferably 35 to 55 mass %, and further preferably 40 to 50 mass % in 100 mass % of the total amount of the component A and the component B. Each lower limit of the range of the blending ratio of the component A is set from the viewpoint of making adhesion with a metallic vapor deposition film favorable, and each upper limit is set from the viewpoint of making flatness of a cured coating film favorable.

[Component B]

The component B that is (meth)acrylate may be appropriately selected according to demand performance of a cured coating film.

Specific examples of a monomer having one (meth) acryloyl group which can be used as the component B include the following monomers: hydroxyl group-containing hydrocarbons such as 2-hydroxyethyl (meth)acrylate, 2-hydroxypropyl (meth)acrylate, and 4-hydroxybutyl (meth)acrylate; hydrocarbons such as 2-ethyl-hexyl (meth)acrylate, lauryl (meth)acrylate, and 2-isobutyl-2-methylacrylate; cyclic skeletons such as tetrahydrofurfuryl (meth)acrylate, 2-ethyl-2-methyl-1,3-dioxolane-4-yl-methyl (meth)acrylate, isobornyl (meth)acrylate, norbornyl (meth)acrylate, adamantyl (meth)acrylate, benzyl (meth)acrylate, phenyl (meth)acrylate, dicyclopentenyl (meth)acrylate, dicyclopentanyl (meth)acrylate, phenyloxyethyl (meth)acrylate, phenyloxy diethylene glycol (meth)acrylate, ethylene oxide-modified cresol (meth)acrylate, nonyl phenyloxyethyl (meth)acrylate, para-cumyl phenyloxyethyl (meth)acrylate, dicyclopentanyloxyethyl (meth)acrylate, dicyclopentenyloxyethyl (meth)acrylate, cyclohexyloxyethyl (meth)acrylate, t-butylcyclohexyloxyethyl (meth)acrylate, benzyloxyethyl (meth)acrylate, isobornyloxyethyl (meth)acrylate, norbornyloxyethyl (meth)acrylate, and adamantyloxyethyl (meth)acrylate; alkoxy acrylates such as 2-methoxy ethyl (meth)acrylate, 3-methoxy butyl (meth)acrylate, methoxy diethylene glycol (meth)acrylate, methoxy triethylene glycol (meth)acrylate, methoxy dipropylene glycol (meth)acrylate, methoxy tripropylene glycol (meth)acrylate, methoxy dibutylene glycol (meth)acrylate, methoxy tributylene glycol (meth)acrylate, ethoxy diethylene glycol (meth)acrylate, ethoxy triethylene glycol (meth)acrylate, ethoxy dipropylene glycol (meth)acrylate, ethoxy tripropylene glycol (meth)acrylate, ethoxy dibutylene glycol (meth)acrylate, ethoxy tributylene glycol (meth)acrylate, and butoxy ethyl (meth)acrylate; amines such as dimethylacrylamide; and heterocycles such as acryloyl morpholine.

Specific examples of a monomer having two (meth) acryloyl groups which can be used as the component B include the following monomers: cyclic skeletons such as tricyclodecane dimethanol di(meth)acrylate, cyclohexane dimethanol di(meth)acrylate, hydrogenated bisphenol A di(meth)acrylate, and bisphenoxy fluorene ethanol di(meth)acrylate; isocyanurates such as bis(2-acryloyloxyethyl)-2-hydroxyethyl isocyanurate; trimethylolpropanes such as neopentyl glycol-modified trimethylolpropane di(meth)acrylate; hydrocarbons such as 1,4-butanediol di(meth)acrylate, 1,5-pentanediol di(meth)acrylate, neopentyl glycol di(meth)acrylate, 3-methyl-1,5-pentanediol di(meth)acrylate, 2,4-diethyl-1,5-pentanediol di(meth)acrylate, 1,6-hexanediol di(meth)acrylate, 1,7-heptanediol di(meth)acrylate, 1,8-octanediol di(meth)acrylate, 1,9-nonanediol di(meth)acrylate, 2-methyl-1,8-octanediol di(meth)acrylate, 1,10-decanediol di(meth)acrylate, 1,11-undecane di(meth)acrylate, 1,12-dodecanediol di(meth)acrylate, 1,13-tridecanediol di(meth)acrylate, and 1,14-tetradecanediol di(meth)acrylate; tripropylene glycol di(meth)acrylate, and polybutylene glycol di(meth)acrylate.

Specific examples of a monomer having three (meth) acryloyl groups which can be used as the component B include the following monomers: pentaerythritols such as pentaerythritol tri(meth)acrylate and ethoxylated pentaerythritol tri(meth)acrylate; trimethylolpropanes such as trimethylolpropane tri(meth)acrylate and trisethoxylated trimethylolpropane tri(meth)acrylate; and isocyanurates such as tris(2-acryloyloxyethyl) isocyanurate.

Specific examples of a monomer having four or more (meth)acryloyl groups which can be used as the component B include the following monomers: pentaerythritols such as dipentaerythritol penta(meth)acrylate, dipentaerythritol hexa(meth)acrylate, caprolactone-modified dipentaerythritol penta(meth)acrylate, caprolactone-modified dipentaerythritol hexa(meth)acrylate, pentaerythritol tetra(meth)acrylate, and ethoxylated pentaerythritol tetra(meth)acrylate; and trimethylolpropanes such as ditrimethylolpropane tetra(meth)acrylate.

Specific examples of epoxy poly(meth)acrylate which can be used as the component B include bisphenol type epoxy di(meth)acrylate and novolac type epoxy di(meth)acrylate.

Specific examples of polyester (meth)acrylate which can be used as the component B include compounds obtained by reacting a polybasic acid such as phthalic acid, succinic acid, hexahydrophthalic acid, tetrahydrophthalic acid, terephthalic acid, azelaic acid, or adipic acid, a polyhydric alcohol such as ethylene glycol, hexanediol, polyethylene glycol, or polytetramethylene glycol, and (meth)acrylic acid or a derivative thereof.

Specific examples of urethane (meth)acrylate which can be used as the component B include those obtained by reacting hydroxy group-containing (meth)acrylate having one (meth)acryloyloxy group and one hydroxy group, and as necessary, a diol such as alkane diol, polyether diol, polybutadiene diol, polyester diol, or polycarbonate diol with an organic isocyanate compound.

Among these, from the viewpoint of hardenability and heat resistance of the coating film, the component B preferably contains polyfunctional (meth)acrylate having two to six (meth)acryloyloxy groups. As the polyfunctional (meth)acrylate, tricyclodecane dimethanol di(meth)acrylate, bis(2-acryloyloxyethyl)-2-hydroxyethyl isocyanurate, pentaerythritol tri(meth)acrylate, trimethylolpropane tri(meth)acrylate, tris(2-acryloyloxyethyl) isocyanurate, pentaerythritol tetra(meth)acrylate, dipentaerythritol penta(meth)acrylate, dipentaerythritol hexa(meth)acrylate, and polyester (meth)acrylate are preferable. These monomers can be used singly or in combination of two or more kinds thereof.

The ratio of the component B used is 40 to 80 mass %, preferably 40 to 70 mass %, more preferably 45 to 65 mass %, and further preferably 50 to 60 mass % in 100 mass % of the total amount of the component A and the component B. Each lower limit of the range of the blending ratio of the component B is set from the viewpoint of improving hardenability of the coating film, and each upper limit is set from the viewpoint of making adhesion of the coating film with the metallic vapor deposition film favorable.

[Component C]

The component C that is a silane coupling agent is a component providing adhesion to a cured coating film of the coating material composition. Examples of the silane coupling agent which can be used as the component C include the following compounds:

vinyltrimethoxysilane, vinyltriethoxysilane, vinyl-tris(2-methoxyethoxy)silane, N-(2-aminoethyl)3-aminopropylmethyldimethoxysilane, N-(2-aminoethyl)3-aminopropyltrimethoxysilane, 3-ureidopropyltriethoxysilane, 3-glycidoxypropyltrimethoxysilane, 3-glycidoxypropylmethyldimethoxysilane, epoxycyclohexyl)ethyltrimethoxysilane, 3-chloropropylmethyldimethoxysilane, 3-chloropropyltrimethoxysilane, 3-methacryloxypropyltrimethoxysilane, 3-mercaptopropyltrimethoxysilane, N-(1,3-dimethylbutylidene)-3-(triethoxysilyl)-1-propanamine, N-[2-(vinylbenzylamino)ethyl]-3-aminopropyltrimethoxysilane.hydrochloride, and N,N-bis

[3-(trimethoxysilyl)propyl]ethylenediamine. These can be used singly or in combination of two or more kinds thereof.

Among these, from the viewpoint of having excellent adhesion to both the less-adhesive base material and the metallic vapor deposition film, a silane coupling agent having an amino group or a glycidyl group is preferable, and amino group-containing alkylalkoxysilane such as N-(2-aminoethyl)3-aminopropylmethyldimethoxysilane or N-(2-aminoethyl)3-aminopropyltrimethoxysilane and glycidyl group-containing alkylalkoxysilane such as 3-glycidoxypropyltrimethoxysilane or 3-glycidoxypropylmethyldimethoxysilane are more preferable.

The blending ratio of the component C is 0.3 to 15 parts by mass, preferably 0.5 to 10 parts by mass, more preferably 0.5 to 7 parts by mass, and further preferably 0.5 to 5 parts by mass with respect to 100 parts by mass of the total amount of the component A and the component B. Each lower limit of the range of the blending ratio of the component C is set from the viewpoint of making adhesion of a cured coating film thus obtained to a coated product favorable, and each upper limit is set from the viewpoint of making adhesion of a cured coating film after the heat resistance test to a coated product favorable.

[Component D]

The component D serving as a photopolymerization initiator is an arbitrary component and is a component by which the coating material composition is cured with actinic ray irradiation. Examples of the component D include benzophenone type, anthraquinone type, alkylphenone type, acylphosphine oxide type, thioxanthone type, and phenylglyoxylate type photopolymerization initiators, and specific examples thereof include the following compounds:

benzophenone types such as benzophenone, 4-methylbenzophenone, 2,4,6-trimethylbenzophenone, methyl orthobenzoylbenzoate, and 4-phenylbenzophenone; anthraquinone types such as t-butylanthraquinone and 2-ethylanthraquinone; alkylphenone types such as 2-hydroxy-2-methyl-1-phenylpropan-1-one, oligo{2-hydroxy-2-methyl-1-[4-(1-methylvinyl)phenyl]propanone}, benzyl dimethyl ketal, 1-hydroxycyclohexyl phenyl ketone, benzoin methyl ether, 2-methyl-[4-(methylthio)phenyl]-2-morpholino-1-propanone, and 2-hydroxy-1-[4-[4-(2-hydroxy-2-methylpropionyl)benzyl]phenyl]-2-methylpropan-1-one; thioxanthone types such as 2-benzyl-2-dimethylamino-1-(4-morpholinophenyl)-butanon-1, diethylthioxanthone, and isopropylthioxanthone; acylphosphine oxide types such as 2,4,6-trimethylbenzoyl diphenylphosphine oxide, bis(2,6-dimethoxybenzoyl)-2,4,4-trimethylpentylphosphine oxide, and bis(2,4,6-trimethylbenzoyl)-phenylphosphine oxide; and phenylglyoxylate types such as phenylglyoxylic acid methyl ester. These can be used singly or in combination of two or more kinds thereof.

Among these, from the viewpoint of finger-touch dryness of the coating material composition, benzophenone, 2-ethylanthraquinone, and 2,4,6-trimethylbenzoyl diphenylphosphine oxide are preferable.

In the case of blending the component D, the amount of the component D blended is preferably 0.1 to 20 parts by mass, more preferably 0.5 to 15 parts by mass, and further preferably 1 to 10 parts by mass, with respect to 100 parts by mass of the total amount of the component A and the component B. Each lower limit of the range of the blending ratio of the component D is set from the viewpoint of hardenability of the coating material composition in air atmosphere, and each upper limit is set from the viewpoint of reducing the amount of the photopolymerization initiator remaining in the cured coating film thus obtained.

[Photosensitizer]

Further, a known photosensitizer such as methyl 4-dimethylamino benzoate, ethyl 4-dimethylamino benzoate, amyl 4-dimethylamino benzoate, or 4-dimethylamino acetophenone can be added to the coating material composition of the invention as necessary within the range not deteriorating performance. These can be used singly or in combination of two or more kinds thereof.

[Organic Solvent]

An organic solvent can be blended in the coating material composition of the invention for adjustment to desirable viscosity as necessary. Examples of the organic solvent include the following compounds: ketone-based compounds such as acetone, methyl ethyl ketone, methyl isobutyl ketone, and cyclohexanone; ester-based compounds such as methyl acetate, ethyl acetate, butyl acetate, ethyl lactate, and methoxy ethyl acetate; ether-based compounds such as diethyl ether, ethylene glycol dimethyl ether, diethylene glycol monoethyl ether, diethylene glycol monobutyl ether, and dioxane; aromatic compounds such as toluene and xylene; aliphatic compounds such as pentane, hexane, and petroleum naphtha; alcohol-based compounds such as isopropyl alcohol, isobutanol, and n-butanol; and propylene-glycol-based compounds such as 1-methoxypropanol and 1-methoxypropanol acetate. These can be used singly or in combination of two or more kinds thereof.

[Other Components (Additives)]

Further, additives such as a leveling agent, a deforming agent, an anti-settling agent, a lubricant, a polishing agent, a rust prevention agent, an anti-static agent, a photostabilizer, an ultraviolet ray adsorbing agent, and a polymerization inhibitor may be added to the coating material composition of the invention. Moreover, an acrylic polymer other than the component A1 may be added in order to improve adhesion within the range not deteriorating the effect of the invention.

[Molded Article and Layered Product]

A molded article to which the coating material composition of the invention is applied is not particularly limited, and examples thereof include various molded articles which include less-adhesive base materials including: a thermosetting resin such as BMC; super engineering plastic such as PPS; a metal such as ALD; resins such as a PBT/PET alloy resin, an ABS resin, an acrylonitrile-ethylene-propylenediene-styrene (AES) resin, a PC resin, a high-heat PC resin, an acrylic resin, and a polystyrene resin; polyolefin resins such as polypropylene and polyethylene; and polyester resins such as a PET resin and a PBT resin. Formation of the coating layer of the coating material composition of the invention on these molded articles are achieved by applying the coating material composition of the invention to the surface of a resin molded article (resin base material) and irradiating the coating material composition with actinic rays. The film thickness of the undercoat layer is preferably 3 to 40 μm in terms of thickness of a cured coating film.

Examples of an application method include brush coating, spray coating, dip coating, spin coating, and flow coating methods. From the viewpoint of application workability and flatness and homogeneity of a coating film, a spray coating method and a flow coating method are preferable. In a case where the aforementioned organic solvent is blended in the coating material composition when the coating material composition is applied, it is preferable to volatilize the solvent before the coating film of the coating material composition is cured. At that time, it is preferable that the coating film is heated by an IR heater and/or hot air to volatilize the organic solvent under conditions of a temperature of 30 to 70° C. and a heating time of 2 to 8 minutes.

Further, examples of the actinic ray used for curing the coating material composition of the invention include ultraviolet rays and electron rays. As an ultraviolet ray source, for example, a high-pressure mercury lamp is mentioned. An energy amount of ultraviolet rays radiated for curing the coating material composition is preferably about 300 to 4000 mJ/cm$^2$.

The coating material composition of the invention is suitable as an undercoat material for metallic vapor deposition when a metallic vapor deposition film is formed on a resin molded article. Formation of the metallic vapor deposition film on the resin molded article provided with the undercoat layer of the coating material composition of the invention is performed by a known method of vapor-depositing a metal. According to this, it is possible to obtain a layered product in which a coating layer of the coating material composition of the invention and a metallic vapor deposition film are stacked on a surface of a resin base material in this order. In this layered product, a heat-curing type topcoat layer, an ultraviolet ray-curing type topcoat layer, or a plasma polymerized film can be further formed on the surface of the formed metallic vapor deposition film for the purpose of corrosion prevention of the metallic vapor deposition film and the like.

Since the undercoat layer for metallic vapor deposition formed by the coating material composition of the invention is excellent in adhesion to various plastic base materials and heat resistance, the layered product obtained by stacking the coating layer of the coating material composition of the invention and the metallic vapor deposition film in this order is suitably used for application requiring heat resistance such as automotive lamp members including, for example, a reflecting mirror of an automotive lamp, and the like.

EXAMPLES

Hereinafter, the invention will be described in more detail by Production Examples and Examples.

[Production Example 1] Production of Copolymer A-1

In a four-neck flask having a capacity of 2 L, materials presented in the section of Component 1 in Table 1 were charged, and then the flask was heated such that the liquid temperature in the flask became 110° C. Subsequently, the inside temperature was maintained to 110° C. while the liquid in the flask was stirred, a monomer-containing mixture formed by materials presented in the section of Component 2 in Table 2 was added dropwise over 4 hours into the flask at a constant speed, and then materials presented in the section of Component 3 in Table 1 were put thereinto. Thereafter, 1 g of azobisisobutyronitrile once every hour was additionally put into the flask four times in total (4 g in total), and the mixture was further stirred for 2 hours, thereby obtaining a copolymer A-1. The mass average molecular weight of the copolymer A-1 measured by GPC measurement in terms of polystyrene was 2.5×10$^4$ and the hydroxyl value was 108 mgKOH/g.

TABLE 1

| | Material | Mass (g) | Ratio in whole monomer (mass %) |
|---|---|---|---|
| Component 1 | Toluene | 300 | — |
| | Dibutyl fumarate | 175 | 35 |
| Component 2 | Styrene | 200 | 40 |
| | 2-Hydroxyethyl methacrylate | 125 | 25 |
| | Azobisisobutyronitrile (polymerization initiator) | 5 | — |
| Component 3 | Butyl acetate | 200 | — |
| Component 4 | Azobisisobutyronitrile (polymerization initiator) | 4 | — |

[Production Example 2] Production of Copolymer A-2

A copolymer A-2 having a mass average molecular weight of 4.3×10$^4$ and a hydroxyl value of 108 mgKOH/g was obtained in the same manner as in Production Example 1, except that 3.8 g of PERBUTYL 0 (registered trademark, manufactured by NOF CORPORATION) was used as a polymerization initiator used as the component 2 and 10 g of PERBUTYL 0 was used as a polymerization initiator used as the component 4.

[Production Example 3] Production of Copolymer A-3

A copolymer A-3 having a mass average molecular weight of 2.2×10$^4$ and a hydroxyl value of 129 mgKOH/g was obtained in the same manner as in Production Example 1, except that the monomer used as the component 2 was set to 150 g of styrene (30 mass % of the whole monomer) and 175 g of 2-hydroxyethyl methacrylate (35 mass % of the whole monomer).

[Production Example 4] Production of Copolymer A-4

A copolymer A-4 having a mass average molecular weight of 2.3×10$^4$ and a hydroxyl value of 53 mgKOH/g was obtained in the same manner as in Production Example 1, except that 62.5 g of 2-hydroxyethyl methacrylate (12.5 mass % of the whole monomer) and 62.5 g of methyl methacrylate (12.5 mass % of the whole monomer) were used instead of 125 g of 2-hydroxyethyl methacrylate (25 mass % of the whole monomer) of the monomer used as the component 2.

[Production Example 5] Production of Copolymer A-5

A copolymer A-5 having a mass average molecular weight of 6.2×10$^4$ and a hydroxyl value of 108 mgKOH/g was obtained in the same manner as in Production Example 1, except that 1.4 g of azobisisobutyronitrile and 2.4 g of PERBUTYL Z (registered trademark, manufactured by NOF CORPORATION) were used as a polymerization initiator used as the component 2 and the liquid temperature was set to 100° C.

[Production Example 6] Production of Copolymer PA-1

A copolymer PA-1 having a mass average molecular weight of 2.0×10$^4$ and a hydroxyl value of 215 mgKOH/g was obtained in the same manner as in Production Example 1, except that the monomer used as the component 2 was set to 75 g of styrene (15 mass % of the whole monomer) and 250 g of 2-hydroxyethyl methacrylate (50 mass % of the whole monomer).

[Production Example 7] Production of Copolymer PA-2

A copolymer PA-2 having a mass average molecular weight of $2.0 \times 10^4$ and a hydroxyl value of 0 mgKOH/g was obtained in the same manner as in Production Example 1, except that 125 g of methyl methacrylate (25 mass % of the whole monomer) was used instead of 125 g of 2-hydroxyethyl methacrylate (25 mass % of the whole monomer).

Example 1

1. Preparation of Coating Material Composition 100 parts by mass (50 parts by mass in terms of solid content) of the copolymer A-1 synthesized in Production Example 1 as the component A1, 25 parts by mass of DPHA: dipentaerythritol hexaacrylate (manufactured by Nippon Kayaku Co., Ltd., trade name: KAYARAD DPHA) and 25 parts by mass of M-8030: polyester acrylate (manufactured by TOAGOSEI CO., LTD., trade name: ARONIX M-8030) as the component B, 1 part by mass of KBM-403: 3-glycidoxypropylmethyldimethoxysilane (manufactured by Shin-Etsu Chemical Co., Ltd., trade name: KBM-403) as the component C, 5 parts by mass of benzophenone and 1.5 parts by mass of 2-ethylanthraquinone as the component D, and 5 parts by mass of toluene, 70 parts by mass of 1-methoxypropanol, 30 parts by mass of butyl acetate, and 15 parts by mass of ethyl acetate as the organic solvent were mixed and dissolved to obtain a coating material composition.

2. Preparation of Layered Product for Evaluation

The coating material composition prepared in the above section 1 was spray-coated to a surface of a rectangular plate test piece made of BMC having a size of length 9 cm, width 5 cm, and thickness 3 mm serving as a base material such that the film thickness of the coating film after curing became about 20 μm.

Next, the organic solvent content was volatilized by performing heat treatment at a temperature of 60° C. for 3 minutes in an oven. Thereafter, the coating film was cured in air using a high-pressure mercury lamp by irradiation of ultraviolet rays having an integrated quantity of light of 2000 mJ/cm$^2$ from the upper side of the coated surface. In measurement of the quantity of light, the integrated quantity of energy of ultraviolet rays with a wavelength of 340 nm to 380 nm was measured using UV-351 (SN type) (trade name, manufactured by ORC MANUFACTURING CO., LTD.) as an actinometer. Subsequently, aluminum was vapor-deposited on the cured film (undercoat layer) by a vacuum deposition method using a vacuum deposition apparatus (manufactured by ULVAC, Inc., trade name: EBA-800) such that the film thickness became about 20 nm, thereby forming an aluminum vapor deposition film. Further, an acryl-melamine curable clear coating material (manufactured by Mitsubishi Rayon Co., Ltd., trade name: Diabeam UT-047A) was spray-coated on the aluminum vapor deposition film for the purpose of corrosion prevention of the aluminum vapor deposition film and the like such that the film thickness after curing became 5 μm, and the coating material was then cured by performing heat treatment under conditions of a temperature of 120° C. for 10 minutes, thereby forming a topcoat layer. In this way, a layered product for evaluation having three coating layers formed on the surface of the base material was prepared.

Five types of layered product for evaluation were prepared using test pieces made of PPS, a PBT/PET alloy, PC, and high-heat PC by the same method.

3. Evaluation Method 3-1. Appearance of Coating Film

Appearance of the metallic vapor deposition film of each layered product for evaluation was visually evaluated for evaluation of appearance of the undercoat layer. Determination of visual evaluation was represented by the following criteria.

E (EXCELLENT): Orange peel is not recognized on the surface of the metallic vapor deposition film and the surface is smooth.

G (GOOD): Orange peel is slightly recognized on the surface of the metallic vapor deposition film and the surface is not smooth.

B (BAD): Orange peel is recognized on the surface of the metallic vapor deposition film, the surface is not smooth, and whitening, fogging, or rainbow phenomenon is observed.

3-2. Adhesion of Coating Film

Cross-cut incisions were made using a cutter knife to the metallic vapor deposition film and the undercoat layer formed on the surface of the layered product for evaluation until the depth of the cross-cut incision reached to the base material. Subsequently, an operation of pasting a cellophane tape (registered trademark, manufactured by Nichiban Co., Ltd.) on the surface and then rapidly peeling off the tape (peel test) was repeated up to three times. Interlayer peeling between the undercoat layer and the base material was observed, and the results thereof were represented by the following criteria. Incidentally, interlayer peeling between the undercoat layer and the metallic vapor deposition film was not recognized.

E (EXCELLENT): There is no peeling at the third peel test.
G (GOOD): There is no peeling at the third peel test, but the cut groove of the cross-cut incision is slightly dropped out.
P (POOR): There is peeling at the second and third peel tests.
B (BAD): There is peeling at the first peel test.

3-3. Performance Before and after Heat Resistance Test

Regarding each layered product for evaluation having the coating film formed thereon, appearance and adhesion to the base material of the coating film were evaluated (first stage). In addition, each layered product for evaluation having the coating film formed thereon was left to stand for 24 hours in the atmosphere described in Table 3 and then taken out and appearance and adhesion to the base material of the coating film after the heat treatment were evaluated (after the heat resistance test). Determination of evaluation results was represented by the following criteria.

Appearance of Coating Film

E (EXCELLENT): There is no whitening, fogging, rainbow, and bulging phenomena on the whole surface of the coating film.
G (GOOD): There is any of whitening, fogging, rainbow, and bulging phenomena on a part of the coating film.
B (BAD): There is any of whitening, fogging, rainbow, and bulging phenomena on the whole surface of the coating film.

Adhesion of Coating Film

E (EXCELLENT): There is no peeling at the third peel test.
G (GOOD): There is no peeling at the third peel test, but the cut groove of the cross-cut incision is slightly dropped out.
P (POOR): There is peeling at the second and third peel tests.
B (BAD): There is peeling at the first peel test.

Examples 2 to 20 and Comparative Examples 1 to 9

Coating material compositions were prepared in the same manner as in Example 1, except that blending and compositions were changed to those presented in the composition section of Table 2, Table 4, or Table 7, and then layered products for evaluation were prepared and evaluated. The evaluation results are presented in Table 3, Table 5, or Table 8. Incidentally, abbreviations in Table 2 and Table 4 indicate materials of Table 6 and abbreviations in Table 7 indicate materials of Table 9. Further, units of numerical values in Table 2, Table 4, and Table 7 all are parts by mass.

TABLE 2

| | | | Example 1 | Example 2 | Example 3 | Example 4 | Example 5 | Example 6 | Example 7 | Example 8 |
|---|---|---|---|---|---|---|---|---|---|---|
| Coating material composition | Component A1 | A-1 (in terms of solid content) | 100 (50) | 80 (40) | 90 (45) | 120 (60) | — | 100 (50) | 100 (50) | — |
| | | A-2 (in terms of solid content) | — | — | — | — | 100 (50) | — | — | — |
| | | A-3 (in terms of solid content) | — | — | — | — | — | — | — | 100 (50) |
| | | A-4 (in terms of solid content) | — | — | — | — | — | — | — | — |
| | | A-5 (in terms of solid content) | — | — | — | — | — | — | — | — |
| | Component B | DPHA | 25 | 25 | 25 | 25 | 25 | 25 | 25 | 25 |
| | | DCPA | — | 35 | 30 | — | — | — | — | — |
| | | M-8030 | 25 | — | — | 15 | 25 | 25 | 25 | 25 |
| | Other components | PA-1 (in terms of solid content) | — | — | — | — | — | — | — | — |
| | | PA-2 (in terms of solid content) | — | — | — | — | — | — | — | — |
| | Total amount of component A1, component B, and other components in terms of solid content | | 100 | 100 | 100 | 100 | 100 | 100 | 100 | 100 |
| | Component C | KBM-403 | 1 | 1 | 1 | 1 | 1 | 3 | 0.5 | 1 |
| | | KBM-603 | — | — | — | — | — | — | — | — |
| | Component D | BNP | 5 | 5 | 5 | 5 | 5 | 5 | 5 | 5 |
| | | 2EAQ | 1.5 | 1.5 | 1.5 | 1.5 | 1.5 | 1.5 | 1.5 | 1.5 |
| Organic solvent | | Toluene | 5 | 11 | 8 | — | — | 5 | 5 | 5 |
| | | 1-Methoxypropanol | 70 | 70 | 70 | 70 | 70 | 70 | 70 | 70 |
| | | Butyl acetate | 30 | 34 | 32 | 26 | 26 | 30 | 30 | 30 |
| | | Ethyl acetate | 15 | 15 | 15 | 15 | 15 | 15 | 15 | 15 |

| | | | Example 9 | Example 10 | Example 11 | Example 12 | Example 13 |
|---|---|---|---|---|---|---|---|
| Coating material composition | Component A1 | A-1 (in terms of solid content) | — | — | — | — | 100 (50) |
| | | A-2 (in terms of solid content) | — | 100 (50) | 80 (40) | — | — |
| | | A-3 (in terms of solid content) | — | — | — | — | — |
| | | A-4 (in terms of solid content) | 100 (50) | — | — | — | — |
| | | A-5 (in terms of solid content) | — | — | — | 80 (40) | — |
| | Component B | DPHA | 25 | 50 | 60 | 50 | 25 |
| | | DCPA | — | — | — | — | — |
| | | M-8030 | 25 | — | — | 10 | 25 |
| | Other components | PA-1 (in terms of solid content) | — | — | — | — | — |
| | | PA-2 (in terms of solid content) | — | — | — | — | — |
| | Total amount of component A1, component B, and other components in terms of solid content | | 100 | 100 | 100 | 100 | 100 |
| | Component C | KBM-403 | 1 | 5 | 5 | 5 | — |
| | | KBM-603 | — | — | — | — | 1 |
| | Component D | BNP | 5 | 5 | 5 | 5 | 5 |
| | | 2EAQ | 1.5 | 1.5 | 1.5 | 1.5 | 1.5 |
| Organic solvent | | Toluene | 5 | 5 | 11 | 11 | 5 |
| | | 1-Methoxypropanol | 70 | 70 | 70 | 70 | 70 |
| | | Butyl acetate | 30 | 30 | 34 | 34 | 30 |
| | | Ethyl acetate | 15 | 15 | 15 | 15 | 15 |

TABLE 3

| Base material | Test temperature | Evaluation item | | Example 1 | Example 2 | Example 3 | Example 4 | Example 5 | Example 6 | Example 7 |
|---|---|---|---|---|---|---|---|---|---|---|
| BMC | 180° C. | Initial stage | Appearance | E | E | E | E | E | E | E |
| | | | Adhesion | E | E | E | E | E | E | E |
| | | After heat resistance test | Appearance | E | E | E | E | E | E | E |
| | | | Adhesion | E | E | E | E | E | E | G |
| PPS | 230° C. | Initial stage | Appearance | E | E | E | E | E | E | E |
| | | | Adhesion | E | E | E | E | E | E | E |
| | | After heat resistance test | Appearance | E | E | E | E | G | E | E |
| | | | Adhesion | E | E | E | E | G | G | E |
| PBT/PET | 160° C. | Initial stage | Appearance | E | E | E | E | E | E | E |
| | | | Adhesion | E | E | E | E | E | E | E |
| | | After heat resistance test | Appearance | E | E | E | E | E | E | E |
| | | | Adhesion | E | E | E | E | E | E | E |
| PC | 120° C. | Initial stage | Appearance | E | E | E | E | E | E | E |
| | | | Adhesion | E | E | E | E | E | E | E |
| | | After heat resistance test | Appearance | E | E | E | E | E | E | E |
| | | | Adhesion | E | E | E | E | E | E | E |
| High-heat PC | 150° C. | Initial stage | Appearance | E | E | E | E | E | E | E |
| | | | Adhesion | E | E | E | E | E | E | E |
| | | After heat resistance test | Appearance | E | E | E | G | E | E | E |
| | | | Adhesion | E | E | E | E | E | E | E |

| Base material | Test temperature | Evaluation item | | Example 8 | Example 9 | Example 10 | Example 11 | Example 12 | Example 13 |
|---|---|---|---|---|---|---|---|---|---|
| BMC | 180° C. | Initial stage | Appearance | E | E | E | E | E | E |
| | | | Adhesion | E | E | E | E | E | E |
| | | After hear resistance test | Appearance | E | E | E | E | E | E |
| | | | Adhesion | E | E | E | E | G | E |
| PPS | 230° C. | Initial stage | Appearance | E | E | E | E | E | E |
| | | | Adhesion | E | E | E | E | G | E |
| | | After heat resistance test | Appearance | G | G | E | E | E | E |
| | | | Adhesion | E | E | G | G | G | E |
| PBT/PET | 160° C. | Initial stage | Appearance | E | E | E | E | E | E |
| | | | Adhesion | E | E | E | E | E | E |
| | | After heat resistance test | Appearance | E | G | E | E | E | E |
| | | | Adhesion | E | G | E | E | E | E |
| PC | 120° C. | Initial stage | Appearance | E | E | E | E | E | E |
| | | | Adhesion | E | E | E | E | E | E |
| | | After heat resistance test | Appearance | E | E | E | E | E | E |
| | | | Adhesion | E | E | E | E | E | E |
| High-heat PC | 150° C. | Initial stage | Appearance | E | E | E | E | E | E |
| | | | Adhesion | E | E | E | E | E | E |
| | | After heat resistance test | Appearance | E | E | E | E | E | E |
| | | | Adhesion | E | E | E | E | E | E |

TABLE 4

| | | | Comparative Example 1 | Comparative Example 2 | Comparative Example 3 | Comparative Example 4 | Comparative Example 5 | Comparative Example 6 |
|---|---|---|---|---|---|---|---|---|
| Coating material composition | Component A1 | A-1 (in terms of solid content) | 100 (50) | — | 140 (70) | — | — | — |
| | | A-2 (in terms of solid content) | — | 80 (40) | — | — | — | — |
| | | A-3 (in terms of solid content) | — | — | — | — | — | — |
| | | A-4 (in terms of solid content) | — | — | — | 30 (15) | — | — |
| | | A-5 (in terms of solid content) | — | — | — | — | — | — |
| | Component B | DPHA | 25 | 60 | 25 | 60 | 25 | 25 |
| | | DCPA | — | — | — | — | — | — |
| | | M-8030 | 25 | — | 5 | 25 | 25 | 25 |
| | Other components | PA-1 (in terms of solid content) | — | — | — | — | 100 (50) | — |
| | | PA-2 (in terms of solid content) | — | — | — | — | — | 100 (50) |
| | Total amount of component A1, component B, and other components in terms of solid content | | 100 | 100 | 100 | 100 | 100 | 100 |

TABLE 4-continued

|  |  |  | Comparative Example 1 | Comparative Example 2 | Comparative Example 3 | Comparative Example 4 | Comparative Example 5 | Comparative Example 6 |
|---|---|---|---|---|---|---|---|---|
|  | Component C | KBM-403 | — | 20 | 1 | 1 | 1 | 1 |
|  | Component D | BNP | 5 | 5 | 5 | 5 | 5 | 5 |
|  |  | 2EAQ | 1.5 | 1.5 | 1.5 | 1.5 | 1.5 | 1.5 |
| Organic solvent |  | Toluene | 5 | 11 | — | 26 | 5 | 5 |
|  |  | 1-Methoxypropanol | 70 | 70 | 70 | 70 | 70 | 70 |
|  |  | Butyl acetate | 30 | 34 | 22 | 44 | 30 | 30 |
|  |  | Ethyl acetate | 15 | 15 | 15 | 15 | 15 | 15 |

TABLE 5

| Base material | Test temperature | Evaluation item | | Comparative Example 1 | Comparative Example 2 | Comparative Example 3 | Comparative Example 4 | Comparative Example 5 | Comparative Example 6 |
|---|---|---|---|---|---|---|---|---|---|
| BMC | 180° C. | Initial stage | Appearance | E | E | B | E | B | E |
|  |  |  | Adhesion | B | E | E | B | B | E |
|  |  | After heat resistance test | Appearance | E | E | B | E | B | E |
|  |  |  | Adhesion | B | E | E | B | P | E |
| PPS | 230° C. | Initial stage | Appearance | E | E | B | E | B | E |
|  |  |  | Adhesion | E | E | E | B | B | E |
|  |  | After heat resistance test | Appearance | E | E | B | E | B | B |
|  |  |  | Adhesion | E | B | E | B | B | E |
| PBT/PET | 160° C. | Initial stage | Appearance | E | E | G | E | B | E |
|  |  |  | Adhesion | E | E | E | P | E | E |
|  |  | After heat resistance test | Appearance | E | E | G | E | B | B |
|  |  |  | Adhesion | E | E | E | G | E | E |
| PC | 120° C. | Initial stage | Appearance | E | E | E | E | B | E |
|  |  |  | Adhesion | E | E | E | E | E | E |
|  |  | After heat resistance test | Appearance | E | E | E | E | B | E |
|  |  |  | Adhesion | E | E | E | E | E | E |
| High-heat PC | 150° C. | Initial stage | Appearance | E | E | G | E | B | E |
|  |  |  | Adhesion | E | E | E | E | E | E |
|  |  | After heat resistance test | Appearance | E | E | B | E | B | G |
|  |  |  | Adhesion | E | E | E | E | E | E |

TABLE 6

| Abbreviation | Material |
|---|---|
| A-1 | Copolymer A-1 obtained in Production Example 1 |
| A-2 | Copolymer A-2 obtained in Production Example 2 |
| A-3 | Copolymer A-3 obtained in Production Example 3 |
| A-4 | Copolymer A-4 obtained in Production Example 4 |
| A-5 | Copolymer A-5 obtained in Production Example 5 |
| DPHA | Dipentaerythritol hexaacrylate (manufactured by Nippon Kayaku Co., Ltd., trade name: KAYARAD DPHA) |
| DCPA | Tricyclodecane dimethanol diacrylate (manufactured by Kyoeisha Chemical Co., Ltd., trade name: LIGHT ACRYLATE DCPA) |
| M-8030 | Polyester acrylate (manufactured by TOAGOSEI CO., LTD., trade name: ARONIX M-8030) |
| PA-1 | Copolymer PA-1 obtained in Production Example 6 |
| PA-2 | Copolymer PA-2 obtained in Production Example 7 |
| KBM-403 | 3-Glycidoxypropyltrimethoxysilane |
| KBM-603 | N-(2-Aminoethyl)3-aminopropyltrimethoxysilane |
| BNP | Benzophenone |
| 2EAQ | 2-Ethylanthraquinone |

TABLE 7

|  |  |  | Example 14 | Example 15 | Example 16 | Example 17 | Example 18 | Example 19 |
|---|---|---|---|---|---|---|---|---|
| Coating material composition | Component A1 | A-1 (in terms of solid content) | — | — | — | — | — | — |
|  | Component A2 | AR-1 (in terms of solid content) | 100 (50) | — | — | — | — | — |
|  |  | AR-2 (in terms of solid content) | — | 71.5 (50) | — | — | — | — |
|  |  | AR-3 (in terms of solid content) | — | — | 125 (50) | 100 (40) | 150 (60) | — |
|  |  | AR-4 (in terms of solid content) | — | — | — | — | — | 71.5 (50) |
|  | Component B | DPHA | 25 | 25 | 25 | 25 | 25 | 25 |
|  |  | M-8030 | 25 | 25 | 25 | 35 | 15 | 25 |
|  | Total amount of component A1, component A2, and component B in terms of solid content | | 100 | 100 | 100 | 100 | 100 | 100 |

TABLE 7-continued

|  |  |  |  |  |  |  |  |  |
|---|---|---|---|---|---|---|---|---|
|  | Component C | KBM-403 | 1 | 1 | 1 | 1 | 1 | 1 |
|  | Component D | BNP | 5 | 5 | 5 | 5 | 5 | 5 |
|  |  | 2EAQ | 1.5 | 1.5 | 1.5 | 1.5 | 1.5 | 1.5 |
| Organic solvent |  | Toluene | 5 | 28.5 | — | — | — | 28.5 |
|  |  | 1-Methoxypropanol | 70 | 70 | 70 | 70 | 70 | 70 |
|  |  | Butyl acetate | 30 | 35 | 10 | 25 | — | 35 |
|  |  | Ethyl acetate | 15 | 15 | 15 | 15 | 10 | 15 |

|  |  |  |  | Example 20 | Comparative Example 7 | Comparative Example 8 | Comparative Example 9 |
|---|---|---|---|---|---|---|---|
| Coating material composition | Component A1 | A-1 (in terms of solid content) |  | 50 (25) | — | — | — |
|  | Component A2 | AR-1 (in terms of solid content) |  | — | 100 (50) | — | — |
|  |  | AR-2 (in terms of solid content) |  | — | — | — | — |
|  |  | AR-3 (in terms of solid content) |  | — | — | 175 (70) | 37.5 (15) |
|  |  | AR-4 (in terms of solid content) |  | 35.7 (25) | — | — | — |
|  | Component B | DPHA |  | 25 | 25 | 25 | 25 |
|  |  | M-8030 |  | 25 | 25 | 5 | 60 |
|  | Total amount of component A1, component A2, and component B in terms of solid content |  |  | 100 | 100 | 100 | 100 |
|  | Component C | KBM-403 |  | 1 | — | 1 | 1 |
|  | Component D | BNP |  | 5 | 5 | 5 | 5 |
|  |  | 2EAQ |  | 1.5 | 1.5 | 1.5 | 1.5 |
| Organic solvent |  | Toluene |  | 14.3 | 5 | 25 | 35 |
|  |  | 1-Methoxypropanol |  | 70 | 70 | 70 | 70 |
|  |  | Butyl acetate |  | 35 | 30 | 35 | 35 |
|  |  | Ethyl acetate |  | 15 | 15 | 15 | 15 |

TABLE 8

| Base material | Test temperature | Evaluation item |  | Example 14 | Example 15 | Example 16 | Example 17 | Example 18 |
|---|---|---|---|---|---|---|---|---|
| BMC | 180° C. | Initial stage | Appearance | E | E | E | E | G |
|  |  |  | Adhesion | E | E | E | E | E |
|  |  | After heat resistance test | Appearance | G | E | E | E | E |
|  |  |  | Adhesion | E | E | E | E | E |
| PPS | 230° C. | Initial stage | Appearance | E | E | E | E | G |
|  |  |  | Adhesion | E | E | E | E | E |
|  |  | After heat resistance test | Appearance | E | E | E | E | E |
|  |  |  | Adhesion | E | E | E | E | E |
| PBT/PET | 160° C. | Initial stage | Appearance | E | E | E | E | G |
|  |  |  | Adhesion | E | E | E | E | E |
|  |  | After heat resistance test | Appearance | E | E | E | E | E |
|  |  |  | Adhesion | E | E | E | E | E |
| PC | 120° C. | Initial stage | Appearance | E | E | E | E | E |
|  |  |  | Adhesion | E | E | E | E | E |
|  |  | After heat resistance test | Appearance | G | E | E | E | E |
|  |  |  | Adhesion | E | E | E | E | E |
| High-heat PC | 150° C. | Initial stage | Appearance | E | E | E | E | E |
|  |  |  | Adhesion | E | E | E | E | E |
|  |  | After heat resistance test | Appearance | E | E | E | E | E |
|  |  |  | Adhesion | E | E | E | E | E |

| Base material | Test temperature | Evaluation item |  | Example 19 | Example 20 | Comparative Example 7 | Comparative Example 8 | Comparative Example 9 |
|---|---|---|---|---|---|---|---|---|
| BMC | 180° C. | Initial stage | Appearance | E | G | E | B | E |
|  |  |  | Adhesion | E | E | E | E | B |
|  |  | After heat resistance test | Appearance | E | E | E | B | E |
|  |  |  | Adhesion | E | E | E | E | P |
| PPS | 230° C. | Initial stage | Appearance | E | G | E | B | E |
|  |  |  | Adhesion | E | E | B | E | E |
|  |  | After heat resistance test | Appearance | E | E | E | B | B |
|  |  |  | Adhesion | E | E | E | E | E |
| PBT/PET | 160° C. | Initial stage | Appearance | E | G | E | G | E |
|  |  |  | Adhesion | E | E | B | E | E |

TABLE 8-continued

| | | | | | | | | |
|---|---|---|---|---|---|---|---|---|
| | | After heat resistance test | Appearance | E | E | E | B | E |
| | | | Adhesion | E | E | E | E | E |
| PC | 120° C. | Initial stage | Appearance | E | G | E | E | E |
| | | | Adhesion | E | E | G | E | E |
| | | After heat resistance test | Appearance | E | E | E | B | E |
| | | | Adhesion | E | E | E | E | E |
| High-heat PC | 150° C. | Initial stage | Appearance | E | G | E | G | E |
| | | | Adhesion | E | E | E | E | E |
| | | After heat resistance test | Appearance | E | E | E | B | E |
| | | | Adhesion | E | E | E | E | E |

TABLE 9

| | Material or product name |
|---|---|
| Component A2 | AR-1: linseed oil-modified alkyd resin (manufactured by DIC Corporation, trade name: BECKOSOL EL-4501-50, oil length: 45%) |
| | AR-2: linseed oil-modified alkyd resin (manufactured by DIC Corporation, trade name: BECKOSOL EQV-987, oil length: 50%) |
| | AR-3: safflower oil-modified alkyd resin (manufactured by DIC Corporation, trade name: BECKOSOL ENV-243, oil length: 50%) |
| | AR-4: linseed oil-modified alkyd resin (manufactured by DIC Corporation, trade name: BECKOSOL ENV-241, oil length: 50%) |
| Component B | DPHA: dipentaerythritol hexaacrylate (manufactured by Nippon Kayaku Co., Ltd., trade name: KAYARAD DPHA) |
| | M-8030: polyester acrylate (manufactured by TOAGOSEI CO., LTD., trade name: ARONIX M-8030) |
| Component C | KBM-403: 3-glycidoxypropyltrimethoxysilane (manufactured by Shin-Etsu Chemical Co., Ltd., trade name: KBM-403) |
| Component D | Benzophenone |
| | Ethylanthraquinone |
| Organic solvent | Toluene |
| | 1-Methoxypropanol |
| | Butyl acetate |
| | Ethyl acetate |

From the above-described Examples, it is found out that according to the actinic-ray-curable coating material composition of the invention, an undercoat layer for metallic vapor deposition, which is excellent in adhesion to various base materials, adhesion to a metallic vapor deposition film, appearance, and heat resistance, can be provided. In Comparative Example 1, since the component C was not used, adhesion of the coating film to BMC was not sufficient. In Comparative Example 2, since the amount of the component C used was large, adhesion of the coating film after the heat resistance test to PPS was not sufficient. In Comparative Example 3, since the amount of the component A used was large, appearance at the initial stage and appearance after the heat resistance test of the coating film were not sufficient. In Comparative Example 4, since the amount of the component A used was small, adhesion of the coating film was not sufficient. In Comparative Example 5, since the component A was not used, appearance of the coating film was not sufficient. In Comparative Example 6, since the component A was not used, appearance of the coating film to PPS and the PBT/PET alloy was not sufficient. In Comparative Example 7, since the component C was not used, adhesion of the coating film to the PPS base material and the PBT/PET base material was not sufficient. In Comparative Example 8, since the amount of the component A used was large, appearance at the initial stage and appearance after the heat resistance test of the coating film were not sufficient. In Comparative Example 9, since the amount of the component A used is small, adhesion of the coating film to the BMC base material was not sufficient.

This application claims priority to Japanese Patent Application No. 2016-42408 filed on Mar. 4, 2016 and Japanese Patent Application No. 2016-107456 filed on May 30, 2016, the contents of which are incorporated herein by reference.

Hereinabove, the invention of the present application has been described with reference to the embodiments and examples. However, the invention of the present application is not limited to the above-described embodiments and examples. Various modifications that can be understood by a person skilled in the art can be made to the configuration and details of the invention of the present application within the scope of the invention of the present application.

The invention claimed is:
1. An actinic-ray-curable coating material composition comprising: a resin A; a (meth)acrylate B; and a silane coupling agent C, wherein
the resin A comprises: a polymer A1 having a hydroxyl group with a hydroxyl value of 80 to 200 mgKOH/g; or the polymer A1 and an alkyd resin A2,
a content of the resin A is 20 to 60 mass % and a content of the (meth)acrylate B is 40 to 80 mass % in terms of 100 mass % of the total amount of the resin A and the (meth)acrylate B,
a content of the silane coupling agent C is 0.3 to 15 parts by mass with respect to 100 parts by mass of the total amount of the resin A and the (meth)acrylate B, and
the polymer A1 contains a constituent unit derived from a monomer represented by the following Formula (1):

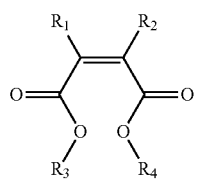

in Formula (1), $R_1$ and $R_2$ each independently represent H or $CH_3$, $R_3$ and $R_4$ each independently represent $C_nH_{2n+1}$, and n is from 1 to 10.

2. The actinic-ray-curable coating material composition according to claim 1, wherein the content of the resin A is 30 to 60 mass % and the content of the (meth)acrylate B is 40 to 70 mass % in terms of 100 mass % of the total amount of the resin A and the (meth)acrylate B.

3. The actinic-ray-curable coating material composition according to claim 1, wherein the resin A comprises the polymer A1 having a mass average molecular weight of 10,000 to 80,000.

4. The actinic-ray-curable coating material composition according to claim 1, wherein the resin A comprises the polymer A1 containing a constituent unit derived from hydroxyalkyl (meth)acrylate.

5. The actinic-ray-curable coating material composition according to claim 1, wherein the resin A comprises the alkyd resin A2 that is an oil-modified alkyd resin.

6. The actinic-ray-curable coating material composition according to claim 1, wherein the (meth)acrylate B contains polyfunctional (meth)acrylate having two to six (meth)acryloyloxy groups.

7. The actinic-ray-curable coating material composition according to claim 6, wherein the (meth)acrylate B contains at least one kind of (meth)acrylate selected from the group consisting of tricyclodecane dimethanol di(meth)acrylate, bis(2-acryloyloxyethyl)-2-hydroxyethyl isocyanurate, pentaerythritol tri(meth)acrylate, trimethylolpropane tri(meth)acrylate, tris(2-acryloyloxyethyl) isocyanurate, pentaerythritol tetra(meth)acrylate, dipentaerythritol penta(meth)acrylate, dipentaerythritol hexa(meth)acrylate, and polyester (meth)acrylate.

8. The actinic-ray-curable coating material composition according to claim 1, wherein the silane coupling agent C has an amino group or a glycidyl group.

9. The actinic-ray-curable coating material composition according to claim 8, wherein the silane coupling agent C contains at least one kind of silane coupling agent selected from the group consisting of N-(2-aminoethyl)3-aminopropylmethyldimethoxysilane, N-(2-aminoethyl)3-aminopropyltrimethoxysilane, 3-glycidoxypropyltrimethoxysilane, and 3-glycidoxypropylmethyl-dimethoxysilane.

10. The actinic-ray-curable coating material composition according to claim 1, further comprising a photopolymerization initiator D.

11. The actinic-ray-curable coating material composition according to claim 10, wherein the photopolymerization initiator D is contained in 0.1 to 20 parts by mass with respect to 100 parts by mass of the total amount of the resin A and the (meth)acrylate B.

12. The actinic-ray-curable coating material composition according to claim 1, wherein the actinic-ray-curable coating material composition is used in an undercoat material for metallic vapor deposition.

13. The actinic-ray-curable coating material composition according to claim 1, wherein the resin A comprises the polymer A1 having a hydroxyl group with a hydroxyl value of 80 to 200 mgKOH/g.

14. The actinic-ray-curable coating material composition according to claim 1, wherein the resin A comprises the polymer A1 having a hydroxyl group with a hydroxyl value of 80 to 140 mgKOH/g and the alkyd resin A2.

15. The actinic-ray-curable coating material composition according to claim 1, wherein the content of the resin A is 40 to 50 mass % and the content of the (meth)acrylate B is 50 to 60 mass % in terms of 100 mass % of the total amount of the resin A and the (meth)acrylate B.

16. A layered product being obtained by stacking a coating layer of an actinic-ray-curable coating material composition and a metallic vapor deposition film on a surface of a resin base material in this order, wherein the actinic-ray-curable coating material composition comprising: a resin A; a (meth)acrylate B; and a silane coupling agent C, wherein
the resin A comprises a polymer A1 having a hydroxyl group with a hydroxyl value of 80 to 200 mgKOH/g and/or an alkyd resin A2,
a content of the resin A is 20 to 60 mass % and a content of the (meth)acrylate B is 40 to 80 mass % in terms of 100 mass % of the total amount of the resin A and the (meth)acrylate B,
a content of the silane coupling agent C is 0.3 to 15 parts by mass with respect to 100 parts by mass of the total amount of the resin A and the (meth)acrylate B, and
the polymer A1 contains a constituent unit derived from a monomer represented by the following Formula (1):

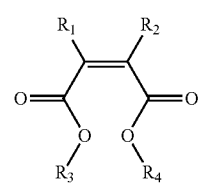

in Formula (1), $R_1$ and $R_2$ each independently represent H or $CH_3$, $R_3$ and $R_4$ each independently represent $C_nH_{2n+1}$, and n is from 1 to 10.

17. The layered product according to claim 16, wherein the layered product is an automotive lamp member.

* * * * *